United States Patent [19]

Kawata

[11] Patent Number: 5,679,448
[45] Date of Patent: Oct. 21, 1997

[54] METHOD OF COATING THE SURFACE OF A SUBSTRATE AND A COATING MATERIAL

[75] Inventor: Kazuki Kawata, Tokyo, Japan

[73] Assignee: Oriental Engineering Co., Ltd., Tokyo, Japan

[21] Appl. No.: 273,649

[22] Filed: Jul. 12, 1994

[30] Foreign Application Priority Data

Jul. 12, 1993 [JP] Japan .................. 5-171712

[51] Int. Cl.[6] ................................. B23B 51/00
[52] U.S. Cl. ................... 428/216; 428/212; 428/697; 428/698; 428/699; 428/701; 428/704
[58] Field of Search .................... 428/697, 698, 428/216, 212, 701, 702, 704, 699

[56] References Cited

U.S. PATENT DOCUMENTS

| | | | |
|---|---|---|---|
| 5,035,957 | 7/1991 | Bartlett et al. | 428/552 |
| 5,071,693 | 12/1991 | Sue et al. | 428/212 |
| 5,208,102 | 5/1993 | Schulz et al. | 428/678 |
| 5,330,853 | 7/1994 | Hofmann et al. | 428/697 |

FOREIGN PATENT DOCUMENTS

| | | |
|---|---|---|
| 62-56565 | 3/1987 | Japan . |
| 2-194159 | 7/1990 | Japan . |
| 5-98422 | 4/1993 | Japan . |

OTHER PUBLICATIONS

"Formation of TiAlN Film by Sputter Ion Plating", Hattori et alia.

"Titanium Aluminum Nitrate Films: A New Alternative to TiN Coatings", Munz Dec. 1986.

*Primary Examiner*—Archene Turner
*Attorney, Agent, or Firm*—Weintraub DuRoss & Brady

[57] ABSTRACT

A method of surface coating a substrate made of metal or ceramic having a three dimensional configuration such as tools, dies or machinery parts, with a surface reinforcing film with good adhesion, at low temperature, in which at least one deposition film is formed on the surface of the substrate by a plasma vapor deposition CVD process, wherein the deposition film comprises:

a multi-layered film comprising one or more of TiAlN film (18$a$) and a film other than TiAlN having a composition in which the total amount of Ti, Al and N is from 50 to 100 at % and in which the uppermost layer as a surface reinforcing film comprises a TiAlN film, or a multi-layered film comprising two or more of TiAlN films having a composition in which the total amount of Ti, Al and N is from 50 to 100 at % and in which the contents of two or more of elements among Ti, Al and N are in a gradient composition.

7 Claims, 2 Drawing Sheets

METHOD OF COATING THE SURFACE OF A SUBSTRATE AND A COATING MATERIAL

BACKGROUND OF THE INVENTION

1. Field of the Invention

The present invention concerns a method of forming TiAlN films of various compositions on the surface of a substrate to be treated such as tools, dies and machine parts having three-dimensional configurations and which are made of metals, ceramics, etc. More particularly, the present invention relates to forming a TiAlN film by using a plasma chemical vapor deposition process (hereinafter referred to as a plasma CVD process) at a low temperature and which exhibits good adhesion, as well as a coating material obtained by the present method.

2. Description of the Prior Art

There has been reported, in recent years, a technique of depositing a TiAlN coating or film having abrasion resistance and oxidation resistance on superhard cutting tools by a PVD process (Surface Technology, Vol. 41, No. 5, 1990, pp. 490–494). As described in the report, the TiAlN film is excellent not only in its abrasion resistance but, also, in its oxidation resistance which renders it different from TiN or TiC films. Referring particularly to the oxidation resistance, it has been stated that a TiAlN film forms a thin amorphous alumina film as a protective film when it is heated to a high temperature, thereby preventing subsequent oxidation. Owing to its excellent characteristics, TiAlN is a protective film for which various application uses are expected in the future.

On the other hand, recently there has been developed a plasma CVD method of forming a deposition film of a high melting compound of excellent abrasion resistance on the surface of a substrate. A plasma CVD process selectively utilizes the respective merits of both a chemical vapor deposition process (a CVD process) and a physical vapor deposition process (a PVD process) instead of such CVD and PVD processes, per se. Such plasma CVD process is disclosed in Japanese Patent Publication Sho 59-13586. This plasma CVD process is based on the same principle as an ion nitriding process and is capable of forming a deposition film of excellent throwing power at a low temperature wherein only a metal halide or the like is present in the gas supplied to a reaction vessel.

Also, a multi-layered film comprising a TiN film, a TiAlN film and an $Al_2O_3$ film, formed by the plasma CVD process, has also been reported. Since the TiAlN film has poor adhesion to a substrate, as compared with a TiN film or the like, it is used for coating superhard alloys rather than tool steels. However, the TiAlN does not have sufficient adhesion, even to the superhard alloys as compared with a TiN film or the like. Further, if the TiAlN film is intended to form a better coating film by forming a multi-layered film with it and another film and, then, combining both of them, the composition of the film to be combined is limited because of the poor adhesion of the TiAlN film with the other film. This results in a problem for application uses.

When depositing a coating of a TiAlN film by the PVD process using a metal solid as an evaporation source or target, it has been difficult to control and vary the composition ratio of each of the elements in the TiAlN film, e.g. Ti and Al, or to form a multi-layered film comprising a TiAlN film and another film. Further, even where possible, the apparatus and controls therefor become complicated and result in an apparatus unsuitable for mass production.

In view of the above, in using the PVD process, it is customary to coat a substrate with a single layer of TiAlN film containing Ti and Al at a constant ratio in the film. However, if a substrate coated with a TiAlN film with lesser Al content shows relatively good adhesion to the substrate, the oxidation resistance at a high temperature, because of the Al content in the TiAlN film, deteriorates. Accordingly, it has been difficult to overcome this drawback while maintaining desired characteristics. The situation is the same for a multi-layered film comprising the TiAlN film of less Al content and at a constant Ti to Al ratio and another film. In addition, when a substrate is coated with a TiAlN film by the PVD process, because the film has poor throwing power, its application use for complicated-shaped products has been limited.

In the above referred to report for forming a multi-layered TiAlN film by the plasma CVD process, the composition of the gases used for forming the TiAlN film is not specifically suggested, nor is the composition ratio for each of the elements. However, when forming a film by the plasma CVD process, if a film of the same composition is prepared by using the same gases as those for the CVD process, the adhesion of the coating film is poor, as compared with the CVD process.

For example, when coating a substrate with a multi-layered film comprising a TiN film and an $Al_2O_3$ film by the CVD process, since the processing temperature is as high as about 1,000° C., there is no adhesion problem between the films. However, if such a multi-layered film is formed by the plasma CVD process, adhesion between the TiN film and the $Al_2O_3$ film is poor and causes delamination between the TiN film and the $Al_2O_3$ film. Thus, if the gases employed in the CVD process are applied in the same way to the plasma CVD process and the film is prepared in the same constitution, the adhesion is poor. Such a disadvantageous phenomenon becomes more conspicuous with a TiAlN film having poor adhesion with the other films.

Further, if an $Al_2O_3$ or AlN film is formed on the TiAlN film, since the $Al_2O_3$ or AlN film has oxidation resistance but lacks toughness and is extremely sensitive to thermal shocks, the $Al_2O_3$ or AlN film, at an extreme surface, tends to suffer from cracks by thermal shock or the like, so that oxidation is caused through the cracks to the underlying film or the film peels entirely. In addition, the characteristics at the surface of the film inherent to the TiAlN film cannot be utilized effectively.

OBJECT AND SUMMARY OF THE INVENTION

For overcoming the foregoing problems, it is an object of the present invention to provide a method of forming TiAlN films of various compositions which exhibit excellent bonding with a substrate and other films, and which are capable of effectively utilizing the characteristics thereof, using a plasma CVD process, as well as the coating material produced by the method.

The present invention provides, in a first aspect, a method of coating a substrate surface with a surface reinforcing film in which at least one deposition film is formed on the surface of the substrate by plasma CVD, wherein the deposition film comprises:

a multi-layered film comprising one or more of a TiAlN film and a film other than TiAlN having a composition in which the total amount of Ti, Al and N is from 50 to 100 at % and in which the uppermost layer as the surface reinforcing film comprises a TiAlN film, a multi-layer film comprising two or more of TiAlN films having a composition in which the total amount of Ti, Al, and N is from 50 to 100 at % and in which contents of two or more of elements among Ti, Al, and N are different, a multi-layered film comprising one or more of TiAlN films having a composition in which the total amount of Ti, Al and N is from 50 to 100% and in which the contents of two or more of elements among Ti, Al and N elements are in a gradient composition.

In this context, "at %" means atom %, which shows the compositional ratio for each of the ingredients by the ratio of number of atoms, whereas "wt %" represents the ratio based on the weight of each of the ingredients.

The processing pressure used in the plasma CVD process according to the invention is suitably within a range from 0.01 to 10 Torr. This is because a complicated substrate surface cannot be formed with a uniform deposition film and the generation of plasmas with a DC voltage is difficult if the processing pressure is lower than 0.01 Torr, and also because the deposition film tends to form a coarse and low density tissue if the processing pressure exceeds 10 Torr.

The processing temperature is suitably within a range from 100° to 800° C. This is because a deposition film of poor crystallinity, coarseness and low density is liable to be formed and adhesion between the substrate and the deposition film is worsened at a substrate temperature of lower than 100° C. If the substrate temperature exceeds 800° C., the deposition film forms a coarse texture having grown crystals, which often causes deformation and variation of size to the substrate.

The plasma may be generated by any suitable method, for example, by DC voltage, DC pulse voltage, AC voltage, high frequency wave, low frequency wave or microwave, alone, or as a combination of two or more.

The plasmas function both for promoting the chemical reaction and heating of the substrate. However, heating of the substrate is conducted, preferably, independent of the effect of the plasmas, by additionally disposing a heater to within the inside, outside or both of the reaction vessel, so that the thickness, physical property, adhesion, or the like of the deposition film can be controlled satisfactorily.

In the present invention, the TiAlN film may contain other elements. The TiAlN film may have the Ti, Al and N components varied depending on the application use. For instance, in addition to a film of a usual composition ratio such as $Ti_{0.2}Al_{0.3}N_{0.5}$, a film of a gradient composition such as $Ti_{0.5-0.25}Al_{0-0.25}N_{0.5}$ can also be used, depending on the application use. A film of a gradient composition may be formed to the substrate by gradually increasing the amount of Al from 0 to 25 at %, and gradually decreasing the amount of Ti from 50 to 25 at % from the boundary between the substrate and the film to the surface of the film.

As to the substrate, a substrate with no surface treatment at all may be used or, depending on the case, a substrate incorporating a gas or metal element by ion implantation or penetration or a substrate having a wet plating applied thereto may also be used.

Furthermore, the TiAlN film may be formed as a multi-layered film having a TiAlN film as the uppermost layer of the surface reinforcing film, in combination with a film other than TiAlN, depending on the application use thereof. In this case, the surface of a substrate is preferably coated with a multi-layered film wherein the film other than TiAlN comprises either: (a) a compound film in which one or more of N, C, O, B and S, as well as one or more of Si and metals belonging to group IVa, Va and VIa of the Periodic Table are chemically bonded; or (b) a metal film comprising one or more of Si and metals belonging to groups IVa, Va and VIa of the Periodic Table.

The surface reinforcing film referred to in the present invention means a film comprising a high melting compound of excellent abrasion resistance formed for the protection and reinforcement of the substrate surface. Accordingly, a coating usually applied for enhancing the commercial value of a substrate coated with a surface reinforcing film, for example, a colored thin decorative TiN film, is not included in the surface reinforcing film referred to in the present invention.

The TiAlN film obtained by coating the surface of the substrate according to the present invention may comprise 0 to 50 at % of one or more of C, O, B, S, Si, Y and metals belonging to Groups IVa, Va and VIa of the Periodic Table. The content of other elements is defined as 0 to 50 at % because the abrasion resistance, oxidation resistance or the like inherent to the TiAlN film is worsened if other elements are incorporated in excess of 50 at %.

As examples of the TiAlN film, there can be mentioned, for example, a $Ti_{0.25}Al_{0.25}B_{0.25}N_{0.25}$ film and a $Ti_{0.25}Al_{0.25}B_{0.25}N_{0.25}$ film.

The thickness of each of the TiAlN film and the film other than TiAlN is 0.1–30 μm. This is because abrasion resistance is insufficient if the film thickness is less than 0.1 um, whereas adhesion is deteriorated and economic disadvantage is caused if it exceeds 30 μm.

The present invention provides, in another aspect, a coating material for a substrate surface having good adhesion and capable of effectively utilizing the surface characteristics of a TiAlN film, formed with at least one deposition film comprising:

a multi-layered film comprising two or more TiAlN films having a composition in which the total amount of Ti, Al and N is from 50 to 100 at % and in which the content of two or more of the Ti, Al and N elements is different, or a multi-layer film comprising one or more TiAlN films having a composition in which the total amount of Ti, Al and N is from 50 to 100 at % and in which the content of two or more of the Ti, Al and N elements is in a gradient composition.

The multi-layered film comprising two or more TiAlN films in which the content of at least one or more of the Ti, Al and N elements is different is formed, for example, by coating a $Ti_{0.4}Al_{0.1}N_{0.5}$ film onto a substrate and, subsequently, coating a $Ti_{0.25}Al_{0.25}N_{0.5}$ film thereon. It is, also, possible to form a film composition of substrate and $Ti_{0.45}A_{0.05N0.5}+Ti_{0.25}Al_{0.25}N_{0.5}$ film and a film composition of substrate and $Ti_{0.45-0.25}Al_{0.05-0.25}N_{0.5}$ (gradient composition film) and $Ti_{0.25}Al_{0.25}N_{0.5}$. Further, if necessary, it is also possible to form a coating material for the substrate surface by forming a film other than TiAlN on the substrate and further forming, thereon, a film of the above-mentioned composition.

Alternatively, the deposition film comprising one or more TiAlN films in which the content of at least one or more of the Ti, Al and N elements is in a gradient composition can include a $Ti_{0.5-0.25}Al_{0-0.25}N_{0.5}$ film coated on the substrate described above, as well as a substrate plus TiN film plus a $Ti_{0.5-0.25}Al_{0-0.25}N_{0.5}$ film plus a $Ti_{0.25}Al_{0.25}N_{0.5}$ film; a substrate plus $Ti_{0.5-0.25}Al_{0-0.25}N_{0.5}$ plus $T_{0.25-0.2}Al_{0.25-0.3}N_{0.5-0.25}O_{0-0.25}$ film; a substrate plus $Ti_{0.5-0.25}Al_{0-0.25}N_{0.5}$ plus $Ti_{0.15}Al_{0.35}N_{0.5}$ film; and a substrate plus TiCNO plus $Ti_{0.5-0.2}Al_{0-0.25}C_{0.2}N_{0.2}O_{0.1}$ film.

In the present invention, various film compositions may, of course, be considered in addition to the foregoing.

It is also effective herein to use a coating material for the substrate surface formed with a multi-layered film wherein the lowermost layer is a compound film in which one or more of N, C, O, B and S as well as one or more of Si and metals belonging to the groups of the Periodic Table are chemically bonded or a metal film other than TiAlN comprising one or more of Si and metals belonging to groups IVa, Va and VIa of the Periodic Table and wherein the uppermost layer, as the surface reinforcing film, is a TiAlN film.

Further, the TiAlN film of the coating material for the substrate surface may be a film containing 0 to 50 at % of one or more of C, O, B, S, Si and Y, as well as one or more metals belonging to groups IVa, Va and VIa of the Periodic Table.

Further, the thickness of each TiAlN film and the film other than TiAlN, as the coating material for the substrate surface, is suitably from 0.1 to 30 μm.

According to the present invention, since the TiAlN film is formed to the surface of the substrate by a plasma CVD process, a film of good throwing power can be formed at a low temperature. Also, the ratio between two Ti and Al elements in the TiAlN film can be varied or a TiAlN film in which the content of one or more of the Ti, Al and N elements is in a gradient composition can be formed, in order to improve the adhesion with the substrate and with other films.

When the surface of a substrate is coated with a multi-layered film comprising one or more TiAlN film and a film other than TiAlN having a composition in which the total amount of Ti, Al and N is from 50–100 at %, and in which the uppermost layer, as the surface reinforcing film, is a TiAlN film, the TiAlN film of the uppermost layer in the coating material for the substrate surface forms the $Al_2O_3$ layer described above. The thus formed $Al_2O_3$ layer may have an appropriate thickness depending on the working temperature thereof and shows better adhesion than usual $Al_2O_3$ layers. Further, since the TiAlN film is excellent, not only in oxidation resistance, but also in toughness and thermal shock resistance, and is different from the $Al_2O_3$ or AlN film, it does not suffer from cracks caused by thermal shock or the like as in a case where the $Al_2O_3$ or AlN film is used as the uppermost layer film of the coating material for the substrate surface. Further, other excellent properties of the TiAlN film as the deposition layer can be fully attained by using the film as the uppermost layer of the coating material for the substrate surface.

When the surface of the substrate is coated with the multi-layered film comprising two or more of TiAlN films having a composition in which the total amount of Ti, Al and N is from 50 to 100 at % and in which the content of two or more of the Ti, Al and N elements is different, the surface is coated with a coating material for the substrate surface comprising the TiAlN film having good adhesion with the substrate, or with another film or films, excellent oxidation is obtained even at high temperature. That is, the film obtained by coating the substrate, first, with the $Ti_{0.4}Al_{0.1}N_{0.5}$ film, i.e., the film of less Al content having a relatively good adhesion with the substrate, and then coating thereover the $Ti_{0.25}Al_{0.25}N_{0.5}$ film having good adhesion with the first film, can increase the adhesion between the substrate and the film and between each of the films, as well as providing the coating material for the substrate surface with a surface of a film composition having a sufficient Al content to form a $Al_2O_3$ layer at a high temperature.

Further, according to the present invention, the adhesion between the substrate and the film and between each of the films can be improved in the same way as described above by coating with one or more TiAlN films having a composition in which the total amount of Ti, Al and N is from 50 to 100 at % and in which the content of at least two or more of the Ti, Al and N elements is in a gradient composition. For example, when the amount of Al is increased gradually from the boundary between the substrate and the film toward the surface of the film, the adhesion between the substrate and the film is improved, as well as the abrasion resistance and the oxidation resistance of the coating material for the substrate surface also being improved.

Further, when the film other than TiAlN is a compound film in which one or more of N, C, O, B and S as well as one or more of Si and metals belonging to groups IVa, Va and VIa of the Periodic Table are chemically bonded or a metal film of one or more of Si and metals belonging to group IVa, Va and VIa of the Periodic Table, the adhesion between the substrate and the film and between each of the films can be improved.

Further, when the TiAlN film contains 0 to 50 at % of one or more of C, O, B, S, Si and Y, as well as a metal belonging to groups IVa, Va or VIa of the Periodic Table, a similar effect can also be obtained without deteriorating the characteristics inherent to the TiAlN film.

Further, if the thickness for each of the TiAlN film and the film other than TiAlN is from 0.1 to 30 μm, the abrasion resistance and the adhesion of the deposition film are not deteriorated.

DESCRIPTION OF THE PREFERRED EMBODIMENT

Figure 1:
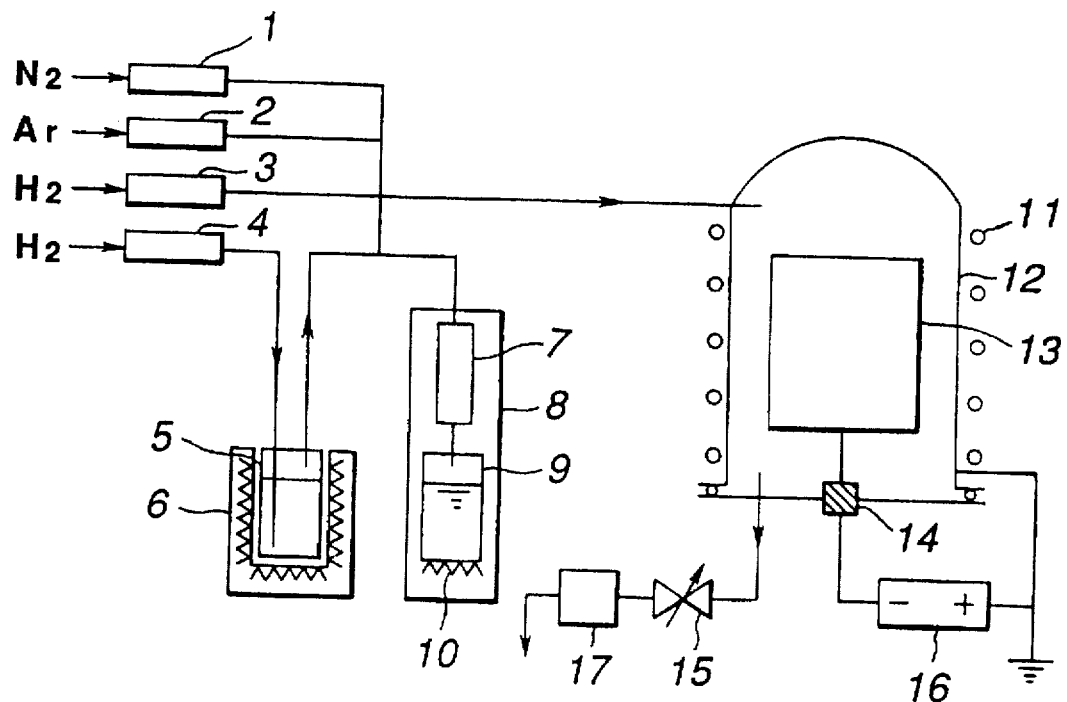
FIG. 1 is a schematic view of a device used for practicing the method according to the present invention.

Referring to FIG. 1 and according to this method, $TiCl_4$ is used as a titanium target. Herein, a vessel 9 containing $TiCl_4$ 4 is heated by a heater 10 for heating the $TiCl_4$ vessel, thereby supplying gaseous $TiCl_4$ through a $TiCl_4$ flowmeter 7 to a reaction vessel 12. In this case, the $TiCl_4$ vessel 9, the heater 10 for heating the $TiCl_4$ vessel and the $TiCl_4$ flow meter 7 are contained in a thermostable bath 8 kept at a constant temperature. The thermostable bath 8 ensures that once gasified, $TiCl_4$ is not liquefied.

Further, $AlCl_3$ is used as an aluminum target. Thus, an $AlCl_3$ vessel 5 containing $AlCl_3$ is heated by a heating furnace 6. Gaseous $AlCl_3$ is supplied thereby and is carried by a carrier gas $H_2$ sent by way of a $H_2$ flow meter 4 into the reaction vessel 12.

The $TiCl_4$ gas and the $AlCl_3$ gas are sent together with $H_2$, Ar and $N_2$ which are sent, respectively, by way of a $H_2$ flow meter 3, an Ar flow meter 2 and a $N_2$ flow meter 1, to the reaction vessel 12. In this case, He, Ne or the like may be added if necessary. Further, $CH_4$, $C_3H_8$, $C_2H_2$, CO, $CO_2$, $NH_3$, $O_2$, $TiI_4$, $(CH_3)_3$Al or the like may also be used as a reaction gas.

Where gases to be introduced are supplied at a constant flow rate into the reaction vessel 12 and evacuated by a vacuum pump 17, the inside of the reaction vessel 12 is kept at an appropriate pressure of 0.01 to 10 Torr by controlling a conductance valve 15.

The gases introduced into the reaction vessel 12 are converted into plasmas in the reaction vessel 12 and a TiAlN film is formed within the plasmas on the surface of a substrate 13.

The plasmas are generated by applying a DC voltage between the substrate 13, acting as a cathode, and the reaction vessel 12, functioning as an anode, from a DC power source 16. The substrate (cathode) 13 and the reaction vessel (anode) 12 are electrically insulated by an insulator 14. If the film is formed only by the generation of the plasmas, the vapor deposition speed is lowered by the sputtering effect of the plasmas. Accordingly, an external heater 11 is disposed on the outside of the reaction vessel 12 which heats the substrate 13. Since this can suppress the plasma power, the vapor deposition speed can be increased and uniform coating can be attained.

Although not shown, it is understood that any of a DC pulse voltage, AC voltage, HF wave, LF wave, microwave or the like may also be utilized in addition to the DC voltage to generate the plasma. Further, the heater may also be disposed on the inside of the reaction vessel 12.

Following are examples of the present invention illustrating the principles hereof with reference to the equipment depicted in FIG. 1. The examples are to be construed as illustrative and not limitative of the present invention.

EXAMPLE I

A coating material for a substrate surface comprising a TiAlN film was formed by using hardened and tempered SKH51 (diameter: 20 mm, height 5 mm, hardness: HRC 62) as the substrate 13.

The substrate 13 was mounted to a jig in the reaction vessel 12 and the pressure inside the reaction vessel 12 was reduced to $10^{-3}$ Torr and then $H_2$ was introduced such that the pressure in the reaction vessel 12 was increased to 2 Torr. A DC voltage of 700 V was applied by the DC power source 16 using the substrate 13 as the cathode and the reaction vessel 12 as the anode. The temperature of the substrate 13 was elevated to 550° C. by the external heater 11. After the temperature was elevated, the gas was switched from $H_2$ to Ar, and the substrate 13 was subjected to sputter cleaning by plasmas at 700 V and a pressure of 2 Torr for 10 min.

Then, a gas mixture at a gas ingredient ratio of $H_2$:Ar:$N^2$:$TiCl_4$=75.0:3.8:18.8:2.4 was introduced such that the pressure in the reaction vessel 12 was set to 2 Torr, and a plasma processing voltage was applied at 700V for 60 min. to form a TiN film. Subsequently, the gas mixture was switched to that at a gas ingredient ratio of $H_2$:Ar:$N_2$:$TiCl_4$:$AlCl_3$=75.0:3.8:18.8:1.2:1.2 and supplied such that the pressure in the reaction vessel 12 was set to 2 Torr, and the plasma processing was continued at 700 V for 90 min. to form a $Ti_{0.25}Al_{0.25}N_{0.5}$ film. Then, heating and electric discharging were interrupted and the inside of the reaction vessel 12 was cooled to a room temperature while keeping the inside at 2 Torr.

Figure 2:
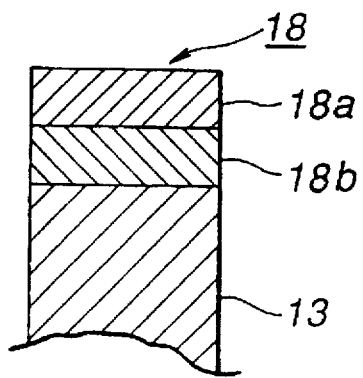
FIG. 2 is a vertical cross-sectional view of a substrate and a coating material for a substrate surface.

As a result and as shown in FIG. 2, a deposition film having a total thickness of 2.5 um and comprising a TiN (1 um) film shown as film 18b, i.e. a film other than TiAlN, and a $Ti_{0.25}Al_{0.25}N_{0.5}$ (1.5 um) film, i.e. a TiAlN film 18a, was formed as a coating material 18 for the substrate surface on the surface of the substrate 13.

EXAMPLE II

Figure 3:
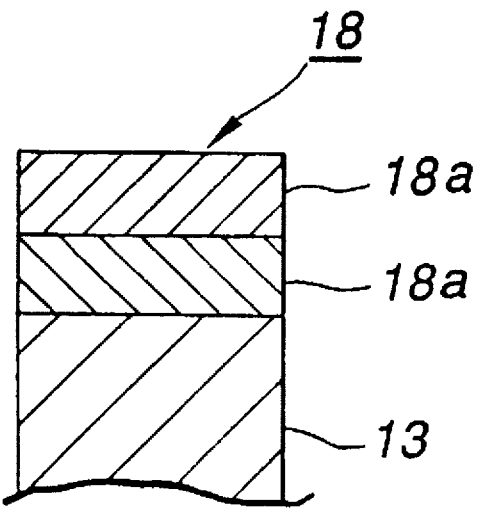
FIG. 3 is a vertical cross-sectional view of a substrate and a coating material for a substrate surface.

Using the equipment of FIG. 1 and following the steps of Example I, a coating was deposited on a substrate in accordance herewith, and as shown in FIG. 3. After applying sputter cleaning, a gas mixture having a gas ingredient ratio of $H_2$:Ar:$N_2$:$TiCl_4$:$AlCl_3$=75.0: 3.8: 18.8: 1.9:0.5 was introduced into the vessel 12 and, then, a plasma processing was applied at a voltage of 700 V for 60 min to form a $Ti_{0.4}Al_{0.1}N_{0.5}$ film. Thereafter, the gas mixture was switched to a gas having an ingredient ratio of $H_2$:Ar:$N_2$:$TiCl_4$:$AlCl_3$= 75.0:3.8:18.8:1.2:1.2. The plasma processing was continued at the same voltage for 90 min so as to form a $Ti_{0.25}Al_{0.25}N_{0.5}$ film. Thus, a $Ti_{0.4}Al_{0.1}N_{0.5}$ (1 μm)+ $Ti_{0.25}Al_{0.25}N_{0.5}$ (1.5 μm) film, comprising a TiAlN film 18a, was formed as a coating material 18 for the substrate surface.

EXAMPLE III

Figure 4:
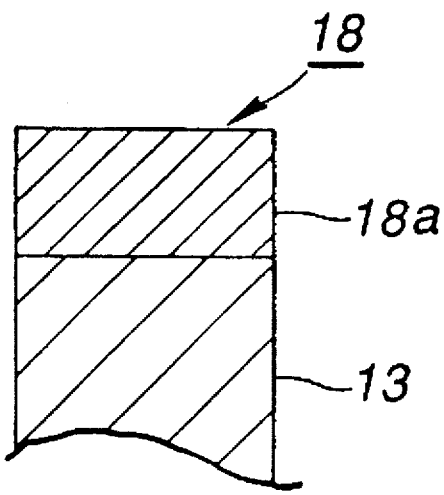
FIG. 4 is a vertical cross-sectional view of a substrate and a coating material for a substrate surface.

Referring now to FIG. 4, and using the procedure of Example I, this example illustrates the preparation of a gradient composition in accordance herewith.

In order to gradually decrease the $TiCl_4$ ratio and gradually increase the $AlCl_3$ ratio, the gas ingredient ratio is set during the processing $H_2$:Ar:$N_2$:$TiCl_4$:$AlCl_3$=75.0:3.8:18.8: (2.4–1.2):(0–1.2) for 150 min. Thus, the substrate surface 13 is coated with a TiAlN film comprising a gradient composition of $Ti_{0.5-0.25}Al_{0-0.25}N_{0.5}$ (2.5 μm).

To evidence the efficacy of the present invention a series of comparative films were prepared using the equipment of Example I and the method described therein.

Comparative Example I

A coating material 18 for a substrate surface was produced by a high frequency plasma CVD process as described below using SKH 51 as the substrate 13 by connecting one of the terminals of a high frequency power source at 56 MHz in parallel with the negative side of the DC power source 16, grounding the other terminal to the earth and, additionally, providing a high frequency power source in the device 12.

The coating material 18 comprising a TiN (1.25 um)= $Al_2O_3$ (1.25 μm) film was produced by first sputtering cleaning and, then, introducing a gas mixture at a gas ingredient ratio of $H_2$:Ar:$N_2$:$TiCl_4$=75.0:3.8:18.8:2.4 to a pressure of 0.4 Torr. Thereafter, a plasma processing was conducted with a high frequency power of 1.5 kW at a DC voltage of 100 V for 75 min to form the TiN film. Subsequently, the gas mixture was switched to that of $H_2$:Ar:$CO_2$:$AlCl_3$=75.0:3.8:18.8:2.4 and the plasma processing conditions were applied for 75 min to form an $Al_2O_3$ film.

Comparative Example 2

A $Ti_{0.25}Al_{0.25}N_{0.5}$ film was formed by the same process as comparative Example I, except that the time for forming the TiN film was 48 min, and the ingredient ratio of the latter-used gas was $H_2$:Ar:$N_2$:$TiCl_4$:$AlCl_3$= 75.0:3.8:18.8:1.2:1.2. The plasma processing was for 48 min and the time for forming the $Al_2O_3$ film was set to 54 min. Thus, a coating material 18 for the substrate surface comprising a TiN (0.8 μm)+$Ti_{0.25}Al_{0.25}N_{0.5}$ (0.8 μm)+$Al_2O_3$ (0.9 μm) film was produced.

Comparative Example 3

An AlN film was formed by the procedure of Comparative Example 2 by using a gas mixture at a gas ingredient ratio of $H_2$:Ar:$N_2$:$AlCl_3$=75.0:3.8:18.8:2.4 instead of forming the $Al_2O_3$ film. A coating material 18 for the substrate surface comprising a TiN (0.8 μm)+Ti$_{0.25}$Al$_{0.25}$N$_{0.5}$ (0.8 μm)+AlN (0.9 μm) film was produced.

Comparative Example 4

A film of a gradient composition of Ti$_{0.5-0}$Al$_{0-0.4}$N$_{0.5-0}$O$_{0-0.6}$ was formed by the process of Comparative Example 2 by using a gas mixture at a gas ingredient ratio of H$_2$:Ar:N$_2$:CO$_2$:TiCl$_4$:AlCl$_3$=75.0:3.8: (18.8–0):(0–18.8): (2.4–0):(0–2.4) after forming the TiN film. By this process a coating material 18 for the substrate surface 13 comprising a TiN (0.8 μm)+Ti$_{0.5-0}$Al$_{0-0.4}$O$_{0-0.6}$ (0.8 μm) +Al$_2$O$_3$ (0.9 μm) film was produced.

Comparative Example 5

A coating material for the substrate surface comprising a single layer TiN (2.5 μm) film was produced by depositing a TiN film onto the substrate 13 by an ion plating process.

Comparative Example 6

A coating material 18 for the substrate surface comprising a Ti$_{0.25}$Al$_{0.25}$N$_{0.5}$ single layer (2.5 μm) film was produced by forming Ti$_{0.25}$Al$_{0.25}$N$_{0.5}$ using an ion plating process.

TABLE 1

| | Vicker's hardness | Load upon occurrence of peeling | Oxidation start temperature in atmosphere |
|---|---|---|---|
| Example I<br>TiN + Ti$_{0.25}$Al$_{0.25}$N$_{0.5}$<br>(1.0 μm) (1.5 μm) | 2,700 | 60 N | 700° C. |
| Example II<br>Ti$_{0.4}$Al$_{0.1}$N$_{0.5}$(1 μm) + Ti$_{0.25}$Al$_{0.25}$N$_{0.5}$(1.5 μm) | 2,700 | 60 N | 700° C. |
| Example III<br>Ti$_{0.5-0.25}$Al$_{0-0.25}$N$_{0.5}$<br>(2.5 μm) | 2,700 | 60 N | 700° C. |
| Comparative Example 1<br>TiN + Al$_2$O$_3$<br>(1.25 μm) (1.25 μm) | 2,000 | 25 N | 700° C. |
| Comparative Example 2<br>TiN(0.8 μm) + Ti$_{0.25}$Al$_{0.25}$N$_{0.5}$<br>(0.8 μm) + Al$_2$O$_3$(0.9 μm) | 2,300 | 30 N | 700° C. |
| Comparative Example 3<br>TiN(0.8 μm) + Ti$_{0.25}$Al$_{0.25}$N$_{0.5}$<br>(0.8 μm) + AlN(0.9 μm) | 2,300 | 23 N | 700° C. |
| Comparative Example 4<br>TiN(0.8 μm) +<br>Ti$_{0.5-0}$Al$_{0-0.4}$N$_{0.5-0}$O$_{0-0.6}$<br>0.8 μm) + (Al$_2$O$_3$(0.9 μm) | 2,200 | 30 N | 700° C. |
| Comparative Example 5<br>TiN(2.5 μm) | 2,000 | 50 N | 500° C. |
| Comparative Example 6<br>Ti$_{0.25}$Al$_{0.25}$N$_{0.5}$<br>(2.5 μm) | 2,700 | 40 N | 700° C. |

Table 1 shows the hardness of the films, results of scratch test and oxidation tests on the coating materials 18 for the substrate surfaces according to Examples 1 to 3 and the coating material 18 for the substrate surfaces according to Comparative Examples 1 to 6.

From Table 1, it can be seen that the coating materials 18 for the substrate surface of Comparative Examples 1 to 4 produced by the high frequency plasma CVD process show good oxidation resistance but poor adhesion since brittle Al$_2$O$_3$ or AlN is present in the uppermost layer. It is believed that if cracks should occur in an Al$_2$O$_3$ or an AlN uppermost layer, this will propagate further to the underlying layer. The coating material 18 for the substrate surface of Comparative Example 5 shows good adhesion but poor oxidation resistance. Also, the coating material 18 for the substrate surface of Comparative Example 6 shows good oxidation resistance but poor adhesion.

On the other hand, it can be seen that the coating materials 18 for the substrate surface of Examples 1 to 3 exhibit excellent hardness and adhesion and, further, have good oxidation resistance.

To illustrate the durability of coatings produced hereby a further series of substrates 13 were prepared in the device of FIG. 1 following the procedure of Example I. The so-coated substrate were, then, compared to similarly coated substrates prepared using the process of Comparative Examples 1 to 4.

Thus, as Examples IV, V and VI, a TiN (1 μm)+ Ti$_{0.25}$Al$_{0.25}$N$_{0.5}$ (1.5 μm) film (Ex. IV); a Ti$_{0.4}$Al$_{0.1}$N$_{0.5}$ (1 μm)+Ti$_{0.25}$Al$_{0.25}$N$_{0.5}$ (1.5 μm) film (Ex. V) and a Ti$_{0.5-0.25}$Al$_{0-0.25}$N$_{0.5}$ (2.5 μm) film (Ex. VI) of gradient composition were coated, respectively, onto SKH 51 cold piercing punches as the substrate 13.

Then, as Comparative Examples 7, 8, 9 and 10, a TiN (1.25 μm)+Al$_2$O$_3$ (1.25 μm) film (C. Ex. 7), a TiN (0.8 um)+Ti$_{0.25}$Al$_{0.25}$N$_{0.5}$ (0.8 μm)+Al$_2$O$_3$ (0.9 μm) film (C. Ex. 8), a TiN (0.8 m)+Ti$_{0.25}$Al$_{0.25}$N$_{0.5}$ (0.8 μm)+AlN (0.9 μm) film (C. Ex. 9), a TiN (0.8 μm)+Ti$_{0.5-0}$Al$_{0-0.4}$N$_{0.5-0}$O$_{0-0.6}$ (0.8 μm)+Al$_2$O$_3$ (0.9 μm) film (C. Ex. 10) were coated, respectively, on the surfaces of the punches. Further, as Comparative Example 11 and Comparative Example 12, a TiN (2.5) μm) film and a Ti$_{0.25}$Al$_{0.25}$N$_{0.5}$ (2.5 μm) film were coated, respectively, on the surface of the punches under the same conditions as those in Comparative Example 5 and Comparative Example 6.

Table 2 shows the effect on endurance obtained by each of the coating materials 18 for their respective substrate surfaces. Since a cold piercing punch is used without lubricant, the punch itself is heated to a considerably high temperature by friction. Accordingly, not only adhesion, abrasion resistance and thermal shock resistance but, also, oxidation resistance are required for the coating material 18 for the substrate surface.

TABLE 2

| | Endurance effect of cold piercing punch (work: S12C, 3.1 mm thick) |
|---|---|
| Example IV<br>TiN + Ti$_{0.25}$Al$_{0.25}$N$_{0.5}$<br>(1.0 μm) (1.5 μm) | 350,000 Shot |
| Example V<br>Ti$_{0.4}$Al$_{0.1}$N$_{0.5}$ + Ti$_{0.25}$Al$_{0.25}$N$_{0.5}$<br>(1.0 μm) (1.5 μm) | 350,000 Shot |
| Example VI<br>Ti$_{0.5-0.25}$Al$_{0-0.25}$N$_{0.5}$ (2.5 μm) | 350,000 Shot |
| Comparative Example 7<br>TiN(1.25 μm) + Al$_2$O$_3$ (1.25 μm) | 5,000 Shot |
| Comparative Example 8<br>TiN(0.8 μm) + Ti$_{0.25}$Al$_{0.25}$N$_{0.5}$<br>(0.8 μm) + Al$_2$O$_3$(0.9 μm) | 7,000 Shot |
| Comparative Example 9<br>TiN(0.8 μm) + Ti$_{0.25}$Al$_{0.25}$N$_{0.5}$<br>(0.8 μm) + AlN(0.9 μm) | 4,000 Shot |
| Comparative Example 10<br>TiN(0.8 μm) +<br>Ti$_{0.5-0}$Al$_{0-0.4}$N$_{0.5-0}$O$_{0-0.6}$<br>(0.8 μm) + Al$_2$O$_3$(0.9 μm) | 8,000 Shot |
| Comparative Example 11<br>TiN(2.5 μm) | 100,000 Shot |
| Comparative Example 12<br>Ti$_{0.25}$Al$_{0.25}$N$_{0.5}$(2.5 μm) | 150,000 Shot |

As can be seen from Table 2, the coating materials 18 for the substrate surface of Comparative Examples 7–10, produced by the high frequency plasma CVD process, result in defoliation at an early stage since brittle $Al_2O_3$ or AlN is present in the uppermost layer, failing to provide a coating effect. In addition, the coating material 18 for the substrate surface of Comparative Example 11 shows poor abrasion resistance and poor oxidation resistance and, accordingly, poor endurance effect. Also, the coating material 18 for the substrate surface of Comparative Example 12 has poor adhesion and, accordingly, shows no satisfactory endurance effect.

On the other hand, it can be seen that the coating materials 18 for the substrate surface of Examples 4–6 have the required adhesion, abrasion resistance, thermal shock resistance and oxidation resistance and, accordingly, show excellent endurance effects.

EXAMPLES VII–IX

Coating materials 18 for a substrate surface were produced, respectively, under the same conditions as those in Examples I–III but using SKD 61 (diameter: 58 mm, thickness: 20 mm, hardness HRC: 45) as the substrate 13.

Comparative Examples 13–18

Coating materials 18 for the substrate surface of Comparative Examples 13 to 18 were produced, respectively, under the same conditions as those in Comparative Examples 1 to 6. Heat fatigue testing was then conducted.

The heat fatigue test was conducted by repeating heating procedures and keeping a test surface (a surface of 58 mm diameter) at 570° C. for 135 sec., water cooling the same and, then, cooling at 100° C. for 5 sec. For inspection, the surface state and the presence of heat cracks for the coating materials 18 for the substrate surface were observed under a scanning type electron microscope.

Table 3 shows the result of the heat fatigue test on the various types of coating materials 18 on the substrate surface.

TABLE 3

| | Surface state | Number of occurrence of cracks |
|---|---|---|
| Example VII<br>TiN + $Ti_{0.25}Al_{0.25}N_{0.5}$<br>(1.0 μm) (1.5 μm) | No change | 3,400 |
| Example VIII<br>$Ti_{0.4}Al_{0.1}N_{0.5}$(1.0 μm) +<br>$Ti_{0.25}Al_{0.25}N_{0.5}$(1.5 μm) | No change | 3,400 |
| Example IX<br>$Ti_{0.5-0.25}Al_{0-0.25}N_{0.5}$(2.5 μm) | No change | 3,400 |
| Comparative Example 13<br>TiN(1.25 μm) + $Al_2O_3$(1.25 μm) | Remarkable defoliation | 50 |
| Comparative Example 14<br>TiN(0.8 μm) + $Ti_{0.25}Al_{0.25}N_{0.5}$<br>(0.8 μm) + $Al_2O_3$(0.9 μm) | Remarkable defoliation | 65 |
| Comparative Example 15<br>TiN(0.8 μm) + $Ti_{0.25}Al_{0.25}N_{0.5}$<br>(0.8 μm) + AlN(0.9 μm) | Remarkable defoliation | 40 |
| Comparative Example 16<br>TiN(0.8 μm) +<br>$Ti_{0.5-0}Al_{0-0.4}N_{0.5-0}O_{0-0.6}$ | Remarkable defoliation | 70 |

TABLE 3-continued

| | Surface state | Number of occurrence of cracks |
|---|---|---|
| (0.8 μm) + $Al_2O_3$(0.9 μm)<br>Comparative Example 17<br>TiN(2.5 μm) | Partial defoliation | 2,000 |
| Comparative Example 18<br>$Ti_{0.25}Al_{0.25}N_{0.5}$(2.5 μm) | Partial defoliation | 2,300 |

It can be confirmed from Table 3 that coating materials 18 for the substrate surface of Examples 7 to 9 exhibit far more excellent heat fatigue characteristics than the coating materials 18 for the substrate surfaces of Comparative Examples 13 and 18.

EXAMPLE X

A $Ti_{0.4}Al_{0.1}N_{0.5}$+$Ti_{0.25}Al_{0.25}N_{0.5}$ film was coated for 150 min. under the same conditions as those in Example 1, onto the inner surface of a pipe made of SUS 304 material.

Comparative Examples 19–20

As a Comparative Example 19, a TiN+$Al_2O_3$ film was coated under the same conditions as those in Comparative Example 1 onto the inner surface of the same type of pipe as that defined in Example X.

As Comparative Example 20, a $Ti_{0.25}Al_{0.25}N_{0.5}$ film was coated under the same conditions as those in Comparative Example 6 to the inner surface of the same type of pipe.

Table 4 shows deposition evaluation for the coating materials for the substrate surface.

TABLE 4

| | Coating state to the inner surface of the SUS 304 pipe (inner dia: 10 mm, outer dia: 20 mm, length: 60 mm) |
|---|---|
| Example X<br>$Ti_{0.4}Al_{0.1}N_{0.5}$<br>+ $Ti_{0.25}Al_{0.25}N_{0.5}$ film | Coated to the entire surface of the pipe<br>(Pipe end face: 2.5 μm; pipe center: 2.5 μm) |
| Comparative Example 19<br>TiN + $Al_2O_3$ | Coated only for a portion 15 mm inside from the end face |
| Comparative Example 20<br>$Ti_{0.25}Al_{0.25}N_{0.5}$ film | Coated only for a portion 10 mm inside from the end face |

As is apparent from Table 4, the coating material 18 for the substrate surface of Example X shows better film throwing power than the coating material 18 for the substrate surface of Comparative Examples 19 and 20.

According to the present invention, since the TiAlN film is formed on the surface of a substrate by a plasma CVD process, a good adhesion coating material for the substrate surface comprising a TiAlN film can be formed on the surface of the substrate. The film has a three dimensional configuration and is formed at low temperature and with good throwing power Since the TiAlN film can be formed on the surface of the substrate, any drawback regarding the adhesion of the TiAlN film can be resolved or overcome without deteriorating the characteristics inherent to the film such as oxidation resistance, abrasion resistance, toughness and heat shock resistance, so that a practical TiAlN film coating material for a substrate surface can be produced.

Since the surface of the substrate is coated with a multilayered film comprising one or more of a TiAlN film and a film other than TiAlN having a composition in which the total amount of Ti, Al and N is from 50 to 100 at % and in which the uppermost layer as the surface reinforcing film is a TiAlN film, a deposition film showing good throwing power and good adhesion at low temperature, as well as excellent oxidation resistance, toughness and thermal shock resistance under high temperature can be formed.

A coating material for a substrate surface exhibiting excellent practical usefulness and having good adhesion on the substrate or other film and which does not deteriorate can, also, be formed by providing a coating of a multi-layer film comprising two or more of TiAlN films having a composition in which the total amount of Ti, Al and N is from 50 to 100 at % and in which the contents of two or more of elements among Ti, Al and N are different.

Further, according to the present invention, it is possible to obtain the same effect as described above as well as the effect of further enhancing the characteristics of the TiAlN film by coating one or more of TiAlN films having a composition in which the total amount of Ti, Al and N is from 50 to 100 at % and in which the contents of two or more of the elements among Ti, Al and N are in a gradient composition.

A coating material for the substrate surface of excellent adhesion can be obtained by a multi-layer film comprising a compound film in which one or more of N, C, O, B and S as well as one or more of Si and metals belonging to Groups IVa, VA and VIa of the Periodic Table are chemically bonded, or a metal film other than TiAlN comprising Si and one or more metals belonging to Groups VIa, VA and VIa of the Periodic Table and a TiAlN film.

Further, the foregoing effect can be made more remarkable by a TiAlN film comprising 0 to 50 at % of C, O, B, S, Si, Y and one or more metals belong to Groups IVa, VA and VIa of the Periodic Table.

Further, the forgoing effect can be fully attained by setting the thickness for each of the TiAlN films and the film other than TiAlN at 0.1 to 30 μm, respectively.

What is claimed is:

1. A multi-layer film coating for a substrate comprising:
    a first and a second TiAlN film, each having a composition in which the total amount of Ti, Al, and N is from 50 to 100 at %,
    wherein the content of Ti and Al in the first TiAlN film differs from the content of Ti and Al in the second TiAlN film,
    the first film being formed on the substrate, the second TiAlN film being formed on the first TiAlN film, the second TiAlN film having a smaller content of Ti and a larger content of Al than the first TiAlN film.

2. A multi-layer film coating for a substrate comprising:
    at least one TiAlN film deposited on a substrate and having an interface therebetween, the film having a total amount of Ti, Al, and N of from 50 to 100 at %, the Ti and the Al being in a gradient composition such that the content of Ti gradually decreases and the content of Al gradually increases from the interface between the substrate and the film toward a surface of the film.

3. A multi-layer film coating according to claim 1 or 2, wherein the TiAlN film is a film containing from 0 to 50 at % of one or more of C, O, B, S, Si and Y, as well as metals belonging to Groups IVa, Va and VIa of the Periodic Table.

4. A multi-layer film coating according to claim 1 or 2, wherein the thickness for each of the TiAlN and the film other than TiAlN is from 0.1 to 30 μm.

5. A multi-layer film coating according to claim 1 or 2, wherein said at least one deposition film is produced by a plasma CVD- process in which the composition of the reaction gas components is varied during the process.

6. A multi-layer film according to claim 1 further comprising:
    a lowermost film formed between the first TiAlN film and the substrate, the lowermost film being:
        (a) a compound film other than TiAlN comprising:
            (1) at least one element selected from the group consisting of N, C, O, B, and S, and
            (2) at least one element selected from the group consisting of Si and the metals belonging to Groups IVa, Va, and VIa of the Periodic Table which are chemically bonded, or
        (b) a metal film other than TiAlN comprising Si and at least one element selected from the group consisting of the metals belonging to Groups IVa, Va, and VIa of the Periodic Table which are chemically bonded.

7. A multi-layer film according to claim 2 further comprising a lowermost film formed between the at least one TiAlN film and the substrate, the lowermost film being a compound film other than TiAlN and comprising:
    (1) at least one element selected from the group consisting of N, C, O, B, and S, and
    (2) at least one element selected from the group consisting of Si and the metals belonging to Groups IVa, Va, and VIa of the Periodic Table which are chemically bonded.

* * * * *